(12) United States Patent
Flachowsky et al.

(10) Patent No.: US 8,563,374 B2
(45) Date of Patent: Oct. 22, 2013

(54) STRAINED SEMICONDUCTOR DEVICES HAVING ASYMMETRICAL HETEROJUNCTION STRUCTURES AND METHODS FOR THE FABRICATION THEREOF

(75) Inventors: Stefan Flachowsky, Dresden (DE); Jan Hoentschel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 102 days.

(21) Appl. No.: 13/235,211

(22) Filed: Sep. 16, 2011

(65) Prior Publication Data

US 2013/0069111 A1 Mar. 21, 2013

(51) Int. Cl.
*H01L 21/336* (2006.01)

(52) U.S. Cl.
USPC .... 438/197; 438/172; 438/513; 257/E21.218; 257/E21.17; 257/E21.221; 257/E21.229; 257/E21.32; 257/E21.421

(58) Field of Classification Search
USPC ......... 438/197, 172, 191, 199, 311, 513, 680, 438/712, 733; 257/E21.17, E21.218, 257/E21.221, E21.229, E21.248, E21.32, 257/E21.421
See application file for complete search history.

(56) References Cited

U.S. PATENT DOCUMENTS

| | | | |
|---|---|---|---|
| 8,253,177 B2 * | 8/2012 | Yu et al. | 257/288 |
| 8,338,259 B2 * | 12/2012 | Wu et al. | 438/300 |
| 8,368,147 B2 * | 2/2013 | Cheng et al. | 257/369 |
| 2006/0030093 A1 * | 2/2006 | Zhang et al. | 438/197 |

* cited by examiner

*Primary Examiner* — David Nhu
(74) *Attorney, Agent, or Firm* — Ingrassia Fisher & Lorenz, P.C.

(57) ABSTRACT

Embodiments of a strained semiconductor device are provided, as are embodiments of a method for fabricating such a strained semiconductor device. In one embodiment, the method includes providing a partially-fabricated semiconductor device including a semiconductor substrate having a source side and a drain side, a gate stack formed on the semiconductor substrate, and a channel region formed within the semiconductor substrate beneath the gate stack and extending from the source side to the drain side of the semiconductor substrate. A cavity is produced in only one of the source side and the drain side of the semiconductor substrate, and a strain-inducing material is formed within the cavity to create an asymmetric heterojunction structure within the semiconductor substrate.

19 Claims, 4 Drawing Sheets

STRAINED SEMICONDUCTOR DEVICES HAVING ASYMMETRICAL HETEROJUNCTION STRUCTURES AND METHODS FOR THE FABRICATION THEREOF

TECHNICAL FIELD

The present invention relates generally to semiconductor devices and, more particularly, to strained semiconductor devices having asymmetrical heterojunction structures, as well as to methods for fabricating strained semiconductor devices.

BACKGROUND

Although technically referring a semiconductor device having a metal gate electrode and an oxide gate insulator, the term "MOS transistor" is now commonly utilized (and is utilized herein) to refer to any semiconductor device including a conductive gate electrode (whether metal or other conductive material) positioned over a gate insulator (whether oxide or other insulator), which is, in turn, positioned over a semiconductor substrate. The gain of a MOS transistor, usually defined by the transconductance ($g_m$), is proportional to the mobility ($\mu$) of the majority carrier in the transistor channel. The current carrying capacity, and hence the performance of a MOS transistor, is proportional to the mobility of the majority carrier in the channel. The mobility of holes, the majority carrier in a P-channel MOS (PMOS) transistor, can be enhanced by embedding a compressive strain-inducing material, such as silicon germanium (SiGe), in the source/drain (S/D) regions of the semiconductor substrate adjacent the opposing channel ends. Conversely, the mobility of electrons, the majority carrier in an N-channel MOS (NMOS) transistor, can be increased by embedding a tensile strain-inducing material, such as carbon-doped silicon (SiC), in the S/D regions and adjacent the channel ends. Conventionally-known stress engineering methods are capable of greatly enhancing transistor performance by improving drive current and switching speed without increasing device size and capacitance.

Embedding of strain-inducing materials adjacent opposing channel ends results in the formation of interfaces between dissimilar materials (i.e., the silicon of the channel and the neighboring bodies of strain material) referred to as "heterojunctions." When flowing from source to drain, the majority carriers are required to cross two such heterojunctions, one located adjacent the source end of the channel (the "source-side heterojunction") and the other located adjacent the drain end of the channel (the "drain-side heterojunction"). The source-side heterojunction and the drain-side heterojunction are symmetrically positioned with respect to the channel. Depending upon device polarity, either the source-side heterojunction or the drain-side heterojunction will create an energy barrier opposing current flow. By way of example, FIG. 1 illustrates an energy band diagram for a simplified PMOS transistor 20 having a channel 22 underlying a gate stack 24 and extending from a source region 26 to a drain region 28. Both source region 26 and drain region 28 have been embedded with SiGe, as indicated in FIG. 1 by cross-hatching. When current flows from source region 26 to drain region 28 (represented by arrow 30), the majority carrier (holes) travels across source-side and drain-side heterojunctions 32 and 34, respectively. As indicated by the illustrated energy band wherein $E_C$ represents the conduction band, $E_V$ represents the valence band, and $E_G$ represents the bandgap, the valence energy of the majority carriers decreases when crossing source-side heterojunction 32 and increases when crossing drain-side heterojunction 34. When crossing source-side heterojunction 32, the majority carriers are required to overcome an energy barrier, which reduces current flow and decelerates carrier velocity. An analogous case occurs for an NMOS transistor wherein, when flowing from source to drain, the majority carriers (electrons) are required to overcome an increase the in band gap at the drain-side heterojunction formed between the silicon channel and the embedded strain-inducing material (e.g., SiC).

It would thus be desirable to provide embodiments of a strained semiconductor device fabrication method wherein the above-described heterojunction energy barrier is effectively eliminated to increase overall drive current and switching speed of the resultant device. It would also be desirable to provide embodiments of a strained semiconductor device produced pursuant to such a method. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for fabricating a strained semiconductor device are provided. In one embodiment, the method includes providing a partially-fabricated semiconductor device including a semiconductor substrate having a source side and a drain side, a gate stack formed on the semiconductor substrate, and a channel region formed within the semiconductor substrate beneath the gate stack and extending from the source side to the drain side of the semiconductor substrate. A cavity is produced in only one of the source side and the drain side of the semiconductor substrate, and a strain-inducing material is formed within the cavity to create an asymmetric heterojunction structure.

Embodiments of a strained semiconductor device are further provided. In one embodiment, the strained semiconductor device includes a semiconductor substrate having a source region, a drain region, and a channel region extending between the source region and the drain region. A gate stack is formed on the semiconductor substrate over the channel region, and a strain-inducing material embedded in only one of the source region and the drain region to define an asymmetric heterojunction structure within the semiconductor substrate.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

FIGS. 2-7 are simplified cross-sectional views illustrating a series of fabrication steps that can be performed in the production of an exemplary strained semiconductor device 40. In the illustrated exemplary embodiment, semiconductor device 40 is a PMOS transistor. It is emphasized, however, that the following description is provided by way of non-limiting example only and that one of ordinary skill in the art will readily understand that similar process steps can be utilized to produce other types of semiconductor devices, such as NMOS transistors, with appropriate changes in dopant types and with appropriate changes in the type and location of the embedded strain-inducing material or materials. The below-described method steps can also be utilized in the production of complementary MOS (CMOS) transistors included within a larger integrated circuit, as further described below. Various steps in the manufacture of MOS transistors are well-known and, in the interest of brevity, will only be mentioned briefly herein or will be omitted entirely without providing the well-known process details.

Figure 1:
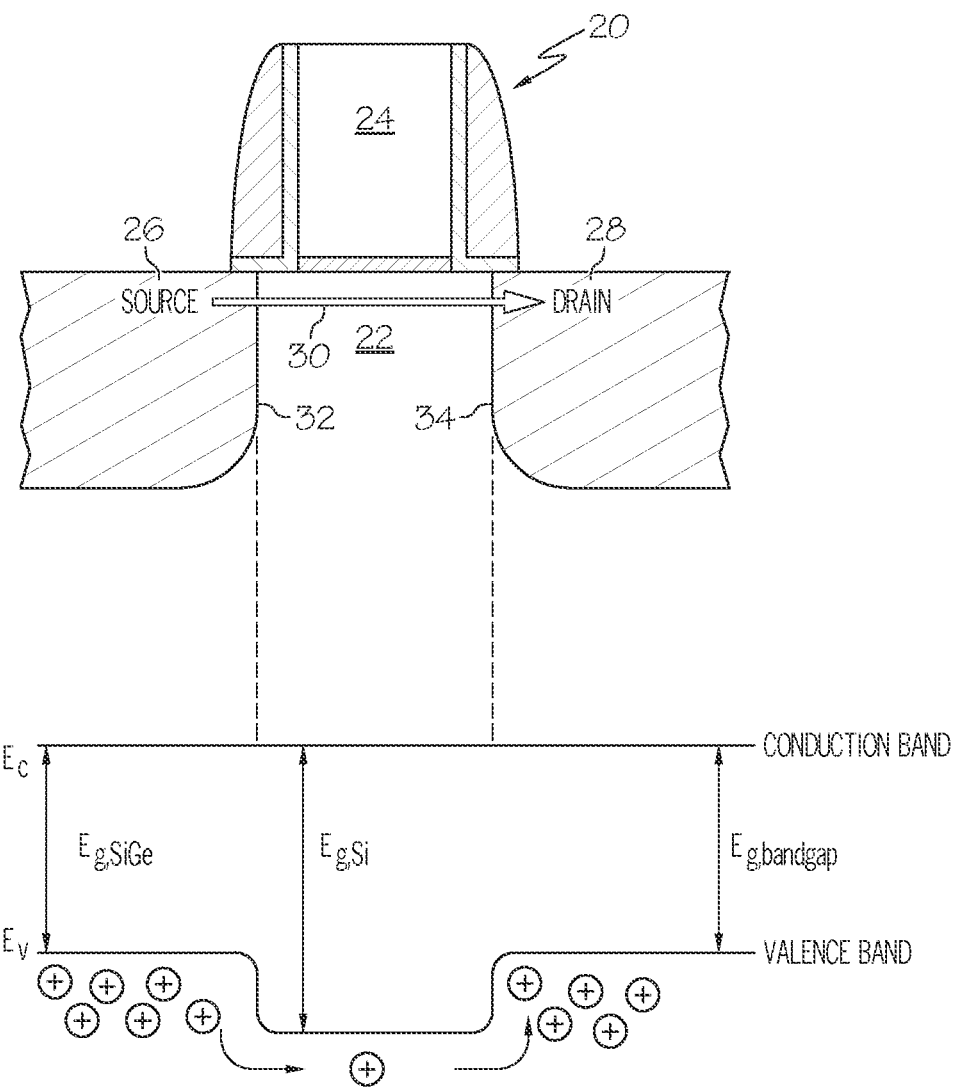
FIG. 1 is an energy band diagram illustrating the manner in which the majority carriers are required to overcome an energy barrier created by the source-side heterojunction in the case of an exemplary PMOS transistor.
Figure 2:
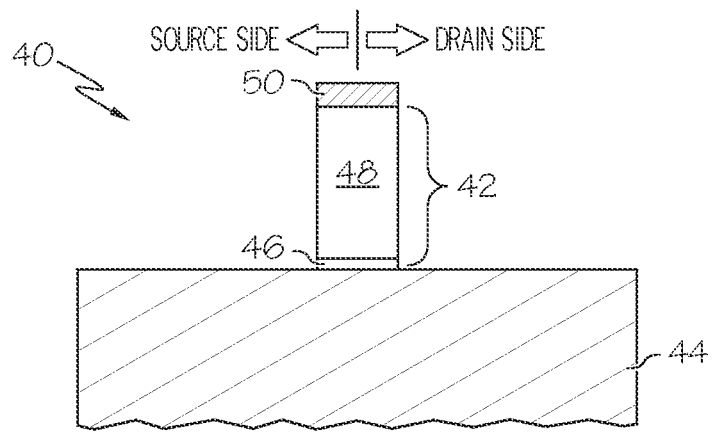
FIGS. 2-7 are simplified cross-sectional views of an exemplary strained semiconductor device at various stages of manufacture and produced pursuant to an exemplary embodiment of the stressed semiconductor device fabrication process.

Referring initially to FIG. 2, the exemplary fabrication method commences with the provision of a partially-fabricated semiconductor device 40 including a gate stack 42 overlying a semiconductor substrate 44. Semiconductor substrate 44 can be a bulk silicon wafer or a silicon-on-insulator ("SOI") wafer. As appearing herein, the term "bulk silicon wafer" is utilized to refer to wafers consisting of relatively pure silicon materials, as well as silicon admixed with one or more additional elements, such as germanium, carbon, or the like. Semiconductor substrate 44 includes a source side (i.e., the side of substrate 44 in which the source region is formed during fabrication) and a drain side (i.e., the side of substrate 44 in which the drain region is formed during fabrication). In the orientation shown in FIGS. 2-7, the source side and drain side of semiconductor substrate 44 correspond to the left side and right side of semiconductor device 40, respectively.

In the illustrated example, gate stack 42 includes two main components: (i) a gate insulator 46 formed over semiconductor substrate 44, and (ii) a gate electrode 48 formed over gate insulator 46. A nitride cap 50 is further formed over gate electrode 48. Gate insulator 46 can be a layer of thermally grown silicon dioxide, a layer of deposited oxide, a layer of material having a high dielectric constant as compared to silicon dioxide (e.g., a high k material), or a layered combination of oxide and high k material. Gate electrode 48 can be a layer of polycrystalline silicon, a metal, a conductive work function-determining material, or a combination of these materials. During fabrication of gate stack 42, a gate insulator layer may first be formed (e.g., thermally grown) over semiconductor substrate 44, and a gate electrode layer (or layers) may be formed (e.g., deposited) over the gate insulator layer. After formation of the gate insulator and gate electrode layers, a nitride capping layer can then be deposited by, for example, plasma enhanced chemical vapor deposition (PECVD) performed utilizing silane and ammonia or nitrogen in the presence of an argon plasma. Lastly, lithographical patterning and etching is carried-out to remove selected potions of the gate insulator layer, the gate layer, and the nitride capping layer to yield gate insulator 46, gate electrode 48, and nitride cap 50, respectively.

The respective thicknesses of gate insulator 46, conductive gate electrode 48, and nitride cap 50 will vary amongst different embodiments; however, by way of non-limiting example, gate insulator 46 is conveniently formed to have a thickness less than approximately 10 nanometers (nm) and, preferably, to have a thickness less than approximately 5 nm; conductive gate electrode 48 is conveniently formed to have a thickness between approximately 10 and 100 nm; and nitride cap 50 is conveniently formed to have a thickness between approximately 10 and 50 nm. In embodiments wherein conductive gate electrode 48 includes a metal gate and an overlying gate electrode, the metal gate may have a thickness of, for example, of approximately 2 nm to approximately 10 nm; while the gate electrode may have a thickness of approximately 10 nm to approximately 100 nm. Although not shown in FIG. 2 for clarity, it will readily be appreciated that various other features may be formed across semiconductor substrate 44 prior to the formation of gate stack 42; e.g., well regions may be formed within selected regions of semiconductor substrate 44 via ion implantation and electrical isolation features may be formed within substrate 44 utilizing known electrical isolation techniques (e.g., shallow trench isolation) to electrically insulate semiconductor device 40 from neighboring devices included within a larger integrated circuit (not shown).

Figure 3:
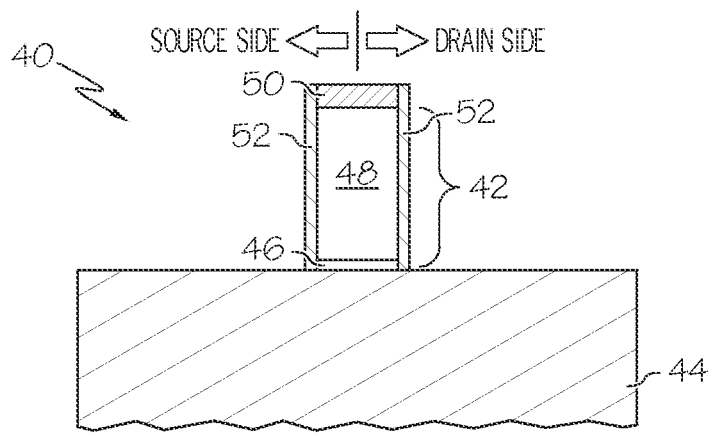

Referring to FIG. 3, sidewall liners or spacers 52 are next formed which, along with nitride cap 52, encapsulate gate stack 42. In one embodiment, sidewall spacers 52 are formed by first depositing a silicon nitride layer over semiconductor device 40 utilizing, for example, PECVD performed utilizing silane and ammonia or nitrogen in the presence of an argon plasma. The silicon nitride layer is then anisotropically etched utilizing a nitride-selective etch chemistry (e.g., $CHF_3$, $CF_4$, or $SF_6$) to yield sidewall spacers 52. The lateral thickness of sidewall spacers 52 should be sufficient to prevent amorphization of the gate material during the angled ion implantation process described below in conjunction with FIG. 4. In one embodiment, the thickness of each sidewall spacer 52 is between about 5 and about 8 nm.

Figure 4:
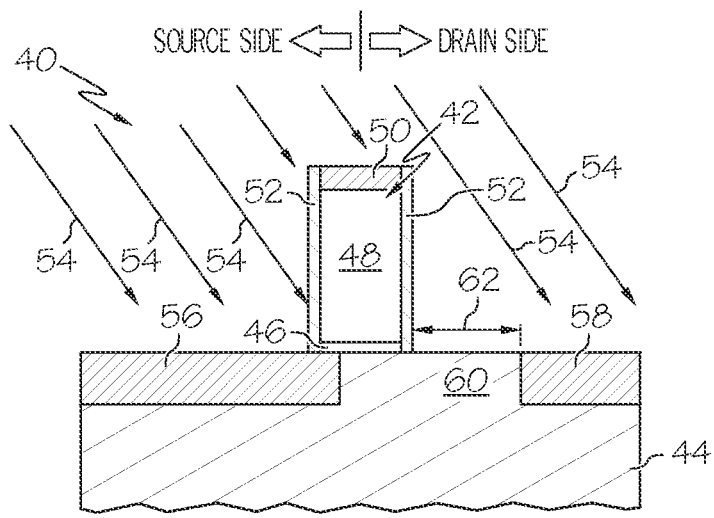

Semiconductor device 40 is next subjected to an angled ion implantation process referred to herein as a "tilted pre-amorphization implant" or, more simply, a "tilted PAI." As generically represented in FIG. 4 by arrows 54, during the tilted PAI, semiconductor device 40 is bombarded with ions from a selected direction forming a predetermined acute grazing angle with the upper surface of silicon substrate 44. The tilted PAI damages the crystalline lattice of semiconductor substrate 44 and results in the amorphization of those portions of substrate 44 impacted by the ions. In the illustrated example, angled ion bombardments results in the creation of first and second amorphized regions 56 and 58. Amorphized region 56 is formed adjacent and extends partially under one side of gate stack 42. Furthermore, amorphized region 56 is formed within the source side of partially-fabricated semiconductor device 40 and may thus generally overlap with the source region later formed within semiconductor substrate 44 via ion implantation and activation, as described below. By comparison, amorphized region 58 is formed at least partially within or adjacent the drain side of semiconductor substrate 44, but is laterally spaced or offset from the opposing side of gate stack 42 by an un-amorphized region 60 of substrate 44 shielded from the angled ion bombardment by gate stack 42 (referred to herein as "shadowed crystalline region 60"). Shadowed crystalline region 60 is self-aligned to gate stack 42 and formed within the drain side of semiconductor substrate 44 between the channel region of semiconductor device 40 and laterally-offset amorphized region 58.

Pursuant to the fabrication method described herein, shadowed crystalline region 60 is embedded with a selected strain-inducing material, while the amorphized regions of substrate 44 are left unprocessed. Whether it is desired to embed strain-inducing material exclusively in the drain side or exclusively in the source side of substrate 44, and thus whether it is desired to amorphize the silicon of substrate 44 located adjacent the source-side sidewall or adjacent the drain-side sidewall of gate stack 42 during the tilted PAI, will depend upon device polarity. In the case of an n-channel transistor, it is desirable to embed a tensile strain-inducing material (e.g., SiC) in the source side of substrate 44 and adjacent the source-end of the channel region; consequently, the tilted PAI will be controlled to amorphize the drain region of the substrate, while the source side of substrate 44 is at least partially shielded from ion bombardment by gate stack 42. Conversely, in the illustrated example wherein semiconductor device 40 is a PMOS transistor, it is desirable to embed a compressive strain-inducing material (e.g., SiGe) in the drain side of semiconductor substrate 44, and the tilted PAI is controlled to amorphize the source side of substrate 44, while the drain side of substrate 44 is at least partially shielded from ion bombardment. In either case, the tilted PIA is performed to amorphize the portion of semiconductor substrate 44 located at one side of gate stack 42 and one end of the channel region, while the portion of substrate 44 located adjacent the opposing side of gate stack 42 and the opposing end of the channel region is shielded from ion bombardment and thus remains in a crystalline state.

Figure 6:
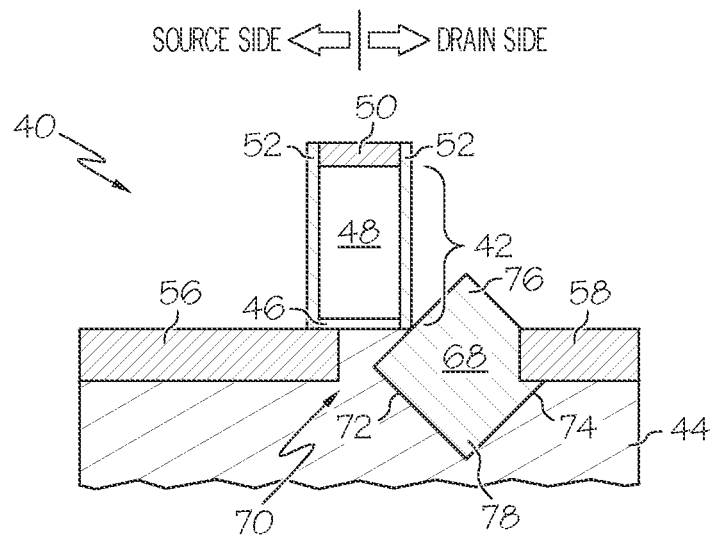

The length of shadowed crystalline region 60 (represented in FIG. 4 by double-headed arrow 62) is partly determinative of the size and shape of the body of strain-inducing material embedded into substrate 44, as described more fully below in conjunction with FIG. 6. Shadowed crystalline region 60 is preferably formed to have a minimum length sufficient to enable the below-described etching and epitaxial growth processes to be reliably and repeatedly performed over multiple iterations of the strain semiconductor fabrication method. Conversely, shadowed crystalline region 60 is preferably imparted with a maximum length that is sufficiently limited to ensure that the source or drain region of any neighboring transistor is fully amorphized during the tilted PAI. In general, the maximum length of shadowed crystalline region 60 will be approximately half of the gate-to-gate spacing between neighboring devices; e.g., in an embodiment wherein the gate pitch is approximately 100 nm, the maximum length of region 60 is preferably 50 nm. In preferred embodiments, the length of crystalline region 60 is between about 15 nm and about 25 nm.

The grazing angle of the tilted PAI will typically range from about 20 degrees to about 30 degrees; however, the grazing angle of the tilted PAI may vary amongst embodiments and will generally be determined, at least in part, as a function of the height of gate stack 42 and the desired length of shadowed crystalline region 60. The particular process parameters employed during the tilted PAI will also vary amongst embodiments. The energy and dosage is preferably selected such that few, if any, ions penetrate through silicon nitride liner 52 encapsulating gate stack 42, while regions 56 and 58 of semiconductor substrate 44 are fully amorphized. Any species of ion suitable for fully amphorizing the silicon of regions 56 and 58 can be implanted during the tilted PAI including, but not limited to, silicon, germanium, xenon, and certain noble gases (e.g., argon, neon, etc.). However, it is generally preferred that relatively heavy ion species is implanted into semiconductor substrate 44 to maximize efficacy, reduce the required dosage, and minimize the duration of the amorphization process. Thus, in a preferred embodiment, silicon, germanium, and/or xenon ions are implanted into regions 56 and 58; and, in a more preferred embodiment, germanium or xenon ions are implanted. In one embodiment wherein germanium or xenon ions are implanted during the tilted PAI, the acceleration voltage can ranges from about 20 to about 40 keV, and the dosage ranges from about $1\times10^{14}$ cm$^{-2}$ to about $1\times10^{15}$ cm$^{-2}$.

Figure 5:
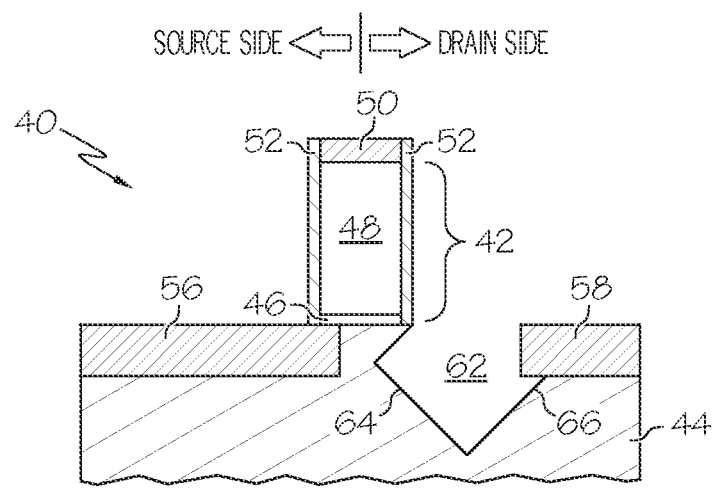

Continuing with the exemplary strained semiconductor fabrication process, shadowed crystalline region 60 is selectively etched to form a cavity within only one of the drain side and source side of substrate 44. Selective etching of region 60 is conveniently accomplished by treating semiconductor device 40, and specifically semiconductor substrate 44, with a wet etchant having a chemistry selective to crystalline silicon over amorphous silicon. In preferred embodiments, the wet etch is carried-out utilizing a chemistry that is crystallographically-selective (i.e., that removes different crystallographic planes at different etch rates) to produce a cavity having a generally diamond-shaped geometry. This may be more fully appreciated by referring to FIG. 5, which illustrates partially-fabricated semiconductor device 40 after a volume of semiconductor substrate 44 has been removed through shadowed crystalline region 60 by contact with a crystallographically-selective etchant to form a diamond-shaped cavity 62 adjacent gate stack 42. As indicated in FIG. 5 at 64, diamond-shaped cavity 62 extends underneath gate stack 42 and into the channel region of semiconductor device 40; and, as further indicated in FIG. 5 at 66, cavity 62 also extends partially under amorphized region 58 of semiconductor substrate 44. In the illustrated example wherein semiconductor device 40 is a PMOS transistor, diamond-shaped cavity 62 is formed within the drain side of substrate 44 adjacent the drain-end of the channel region, while the source side of semiconductor substrate 44 is left intact. Conversely, in embodiments wherein device 40 is an NMOS transistor, a single cavity will be selectively etched within the source side of substrate 44 and adjacent the source-end of the channel region, while the drain side of substrate 44 is left intact. Crystallographically-selective etch chemistries suitable for carrying-out the above-described etching process include, but are not limited to, tetramethylammium hydroxide ("TMAH").

A strain-inducing material is next formed within diamond-shaped cavity 62 utilizing, for example, a selective epitaxial growth (SEG) process. In the illustrated exemplary embodiment wherein semiconductor device 40 is a PMOS transistor, a compressive strain-inducing material is grown within cavity 62, such as embedded epitaxial silicon germanium (eSiGe). Alternatively, in embodiments wherein the semiconductor device is an NMOS transistor and wherein a cavity is selectively etched into the source side of substrate 44, a tensile strain-inducing material can be grown within a cavity, such as silicon carbon (eSiC). With reference to FIG. 6, epitaxial growth results in the formation of a body of strain-inducing material 68, which fills cavity 62 and which is partially embedded within semiconductor substrate 44 adjacent gate stack 42. The diamond-shaped geometry of cavity 62 is imparted to the body of strain-inducing material 68. As a result, the body of strain-inducing material 68 has a first corner or edge 72, which extends underneath gate stack 42 and into the channel region of device 40; a second corner or edge 74, which extends away from the channel region and underneath amorphized region 58; a third corner or edge 76, which projects away from the upper surface of semiconductor substrate 44; and a fourth corner or edge 78, which extends into the body of substrate 44. Notably, the strain induced within the channel region by strain-inducing material 68 may be enhanced due the encroachment of corner or edge 72 into the channel region to further improving carrier mobility.

The foregoing process steps result in the creation of an asymmetrical heterojunction structure 70 within semiconductor substrate 44. In the illustrated exemplary embodiment wherein semiconductor device 40 is a PMOS transistor, asymmetrical heterojunction structure 70 is oriented such that the body of strain-inducing material 68 is embedded exclusively within drain side of substrate 44 and adjacent the drain-end of the channel region. In this manner, an advantageous valence band alignment is provided allowing the majority carriers (holes) to achieve a higher velocity when flowing from the channel region into the drain. At the same time, the creation of an energy barrier at the beginning of the channel, the source, is avoided to improve the ease with which the majority carriers are able to flow into the channel region. By comparison, in embodiments wherein the semiconductor device is an NMOS transistor, the strain-inducing material is embedded exclusively within source side of the substrate and adjacent the source-end of the channel to provide an advantageous conduction band alignment. In this manner, the majority carriers (electrons) achieve a higher velocity traveling from the source into the channel, and the creation of an energy barrier at the drain-side of the channel is prevented. In either case, an asymmetrical heterojunction structure (e.g., structure 70 shown in FIG. 7) is formed within the semiconductor substrate and oriented such that the strain-inducing material is embedded solely or exclusively within either the drain or source side of substrate 44 adjacent one channel end to provide an advantageous band alignment to allow an increased velocity of the majority carriers, while strain-inducing material is not embedded adjacent the opposing channel end to avoid the creation of an energy barrier to carrier flow. This results in significant improvements in drive current and switching speed during device operation as compared to conventional strained semiconductor devices having symmetrically-formed heterojunction structures.

Figure 7:
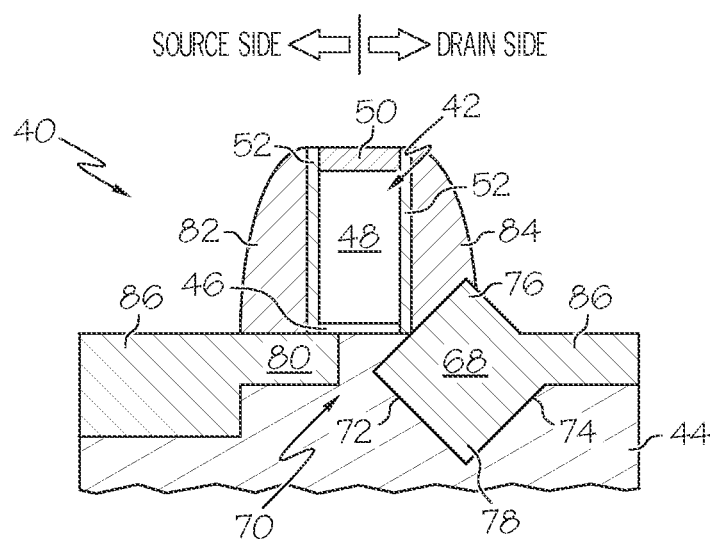

After the formation of heterojunction structure 70 within substrate 44, source/drain extension implants are carried-out to form S/D extensions 80 within semiconductor substrate (only one of which is shown in FIG. 7). Halo doping may also be performed to fine-tune the threshold voltage of semiconductor device 40, if desired. An annealing process (e.g., a laser activation anneal) can then be performed to active S/D extensions 80 and any halo regions. Next, sidewall spaces 82, 84 are produced adjacent gate stack 42. In accordance with one exemplary technique, a spacer-forming material (e.g., silicon oxide, silicon nitride, or an ultra-low k material) is deposited over encapsulated gate stack 42 to form at least one set of sidewall spacers 82, 84, including a sidewall spacer 84 overlying diamond-shaped body of strain-inducing material 68. In this exemplary case, the spacer-forming material can be deposited to a thickness of approximately 15 nm utilizing LPCVD. The spacer-forming material is then anisotropically etched utilizing, for example, a reactive ion etching (RIE) technique employing a carbon hydro-trifluoride, tetrafluoromethane, or sulfur hexafluoride chemistry. After the formation of sidewall spacers 82, 84, source/drain implants may be performed to produce source/drain regions 86 shown in FIG. 7 followed by an activation anneal. Various additional process steps may then be performed to complete fabrication of semiconductor device 40 in the conventionally-known manner.

The foregoing has thus provided embodiments of a strained semiconductor device fabrication method wherein the heterojunction energy barrier is effectively eliminated to increase overall drive current and switching speed of the resultant device. The foregoing has also provided embodiments of a strained semiconductor device produced pursuant to such a method. While described above primarily in conjunction with an exemplary PMOS transistor, embodiments of the above-described fabrication method can be utilized to produce other types of semiconductor devices; e.g., in further embodiments of the above-described fabrication method, an NMOS transistor may be produced including an asymmetrical heterojunction structure formed by embedding a chosen strain-inducing material (e.g., SiC) exclusively within the source side of substrate. Embodiments of the above-described fabrication method can also be utilized to produce CMOS transistors, in which case above-described process steps may initially be performed to create asymmetrical heterojunction structures within a first type of device (e.g., one or more PMOS transistors) while the second type of device (e.g., one or more NMOS transistors) are masked, the masking may then be transferred to the first type of device (e.g., the PMOS transistors), and then similar process steps may be performed to create asymmetrical heterojunction within the second type of device (e.g., the PMOS transistors). Various other steps may be performed in addition or in lieu of the processing steps described above without departing from the spirit and scope of the invention, as set-forth in the appended claims. For example, in further embodiments of the above-described fabrication method, one or more sidewall spacers (e.g., a zero spacer) can be formed after gate stack formation to create a lateral offset or spacing between the channel region and the shadowed crystalline region to more accurately control the position of the embedded strain-inducing material.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention, as set forth in the appended Claims and the legal equivalents thereof.

What is claimed is:

1. A method for fabricating a strained semiconductor device, the method comprising:
   providing a partially-fabricated semiconductor device, comprising:
      a semiconductor substrate having a source side and a drain side;
      a gate stack formed on the semiconductor substrate; and
      a channel region formed within the semiconductor substrate beneath the gate stack and extending from the source side to the drain side of the semiconductor substrate;
   producing a cavity in only one of the source side and the drain side of the semiconductor substrate; and
   forming a strain-inducing material within the cavity to create an asymmetric heterojunction structure within the semiconductor substrate.

2. A method according to claim 1 wherein forming comprises epitaxially growing a strain-inducing material within the cavity.

3. A method according to claim 2 wherein producing a cavity comprises:
   selectively etching only the drain side of the semiconductor device if the semiconductor device is a P-channel transistor; and selectively etching only the source side of the semiconductor device if the semiconductor device is a N-channel transistor.

4. A method according to claim 1 further comprising selectively amorphizing the semiconductor substrate adjacent one side of the gate stack, while preventing amorphization of the semiconductor substrate adjacent the opposing side of the gate stack.

5. A method according to claim 4 wherein producing a cavity comprises exposing the semiconductor substrate to an etchant selective to crystalline silicon over amorphous silicon to produce a cavity in only one of the source side and the drain side of the semiconductor substrate.

6. A method according to claim 5 wherein exposing comprises treating the semiconductor substrate with wet etch chemistry that is crystallographically-selective to produce a cavity in only one of the source side and the drain side of the semiconductor substrate having a substantially diamond-shaped geometry.

7. A method according to claim 6 wherein exposing comprises treating the semiconductor substrate with wet etch chemistry that is crystallographically-selective to produce a cavity in only one of the source side and the drain side of the semiconductor substrate having a substantially diamond-shaped geometry and extending partially underneath the gate stack.

8. A method according to claim 5 wherein exposing comprises treating the semiconductor substrate with wet etch chemistry comprising tetramethylammium hydroxide.

9. A method according to claim 4 wherein selectively amorphizing comprises subjecting the semiconductor substrate to an angled ion bombardment to amorphize the semiconductor substrate adjacent one side of the gate stack, while utilizing the gate stack to shield a shadowed crystalline region of the semiconductor substrate adjacent the opposing side of the gate stack.

10. A method according to claim 9 wherein subjecting the semiconductor substrate to an angled ion bombardment is performed such that the shadowed crystalline region has a length between about 15 nanometers and about 25 nanometers.

11. A method according to claim 9 wherein subjecting the semiconductor substrate to an angled ion bombardment comprises bombarding the semiconductor substrate with ions from a selected direction forming a predetermined grazing angle with the semiconductor substrate ranging from about 20 degrees to about 30 degrees.

12. A method according to claim 9 further comprising encapsulating the gate stack prior to subject the semiconductor substrate to the angled ion bombardment.

13. A method according to claim 9 wherein the semiconductor device further comprises a neighboring gate stack separated from the gate stack by a predetermined gate spacing, and wherein subjecting the semiconductor substrate to an angled ion bombardment is performed such that the shadowed crystalline region has a maximum length less than half the predetermined gate spacing.

14. A method according to claim 1 wherein forming comprises epitaxially growing a body of strain-inducing material within the cavity to create an asymmetric heterojunction structure within the semiconductor substrate.

15. A method according to claim 14 wherein epitaxially growing comprises epitaxially growing a body of strain-inducing material within the cavity having a generally diamond-shaped geometry.

16. A method according to claim 14 wherein epitaxially growing comprises epitaxially growing a body of strain-inducing material within the cavity adjacent the gate stack and extending underneath the gate stack.

17. A method according to claim 14 further comprising forming a sidewall spacer over the body of strain-inducing material.

18. A method for fabricating a strained semiconductor device, the method comprising:
   providing a partially-fabricated semiconductor device including a semiconductor substrate and a gate stack;
   encapsulating the gate stack;
   bombarding partially-fabricated semiconductor device with an angled ion implant to amorphize the semiconductor substrate adjacent a first side of the gate stack while leaving the semiconductor substrate in a crystalline state adjacent the opposing side of the gate stack;
   exposing the partially-fabricated semiconductor device to an etchant selective to crystalline silicon over amorphous silicon to form a cavity adjacent the opposing side of the gate stack; and
   epitaxially growing a strain-inducing material within the cavity.

19. A method for fabricating a semiconductor device according to claim 18 wherein exposing comprises treating the semiconductor substrate with wet etch chemistry that is crystallographically-selective to form a cavity within the semiconductor substrate extending under a portion of the gate stack.

* * * * *